(12) United States Patent
Ishida

(10) Patent No.: US 6,864,158 B2
(45) Date of Patent: Mar. 8, 2005

(54) METHOD OF MANUFACTURING NITRIDE SEMICONDUCTOR SUBSTRATE

(75) Inventor: Masahiro Ishida, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/032,563

(22) Filed: Jan. 2, 2002

(65) Prior Publication Data

US 2002/0102830 A1 Aug. 1, 2002

(30) Foreign Application Priority Data

Jan. 29, 2001 (JP) .......................................... 2001-019549

(51) Int. Cl.⁷ .............................................. H01L 21/20
(52) U.S. Cl. ....................... 438/479; 438/493; 438/489; 438/509; 117/3
(58) Field of Search ................................. 438/479, 489, 438/493, 509, 416, 463, 940, FOR 252, FOR 253, FOR 259, FOR 264, FOR 265, FOR 267, FOR 268, FOR 293, FOR 457, 462, 464, 455, 456, 458, 459, 483, 796, 22, 977, 46, 33, 795, 798, 478; 257/E21.461, E21.601, E21.09, E21.092, E21.097, E21.117, 78, 190, 618, 615, 617, 631, 635; 117/3; 216/62, 65

(56) References Cited

U.S. PATENT DOCUMENTS

| | | | | |
|---|---|---|---|---|
| 4,308,078 A | * | 12/1981 | Cook .......................... | 438/508 |
| 6,071,795 A | * | 6/2000 | Cheung et al. ............. | 438/458 |
| 6,113,685 A | * | 9/2000 | Wang et al. .................... | 117/3 |
| 6,348,096 B1 | * | 2/2002 | Sunakawa et al. ............ | 117/88 |
| 6,426,519 B1 | * | 7/2002 | Asai et al. .................. | 257/103 |

FOREIGN PATENT DOCUMENTS

JP 3091593 8/1994

* cited by examiner

*Primary Examiner*—George Fourson
*Assistant Examiner*—Julio J. Maldonado
(74) *Attorney, Agent, or Firm*—Donald R. Studebaker; Nixon Peabody, LLP

(57) ABSTRACT

A main surface of a base substrate of sapphire is selectively formed an irregular region on the main surface. Then, a semiconductor layer of gallium nitride is grown to fill recessed portions in the irregular region of the base substrate and make the upper surface even. Then, a laser beam is irradiated upon the interface between the semiconductor layer and the irregular region of the base substrate to separate the semiconductor layer from the base substrate. As a result, a nitride semiconductor substrate is produced from the semiconductor layer.

14 Claims, 11 Drawing Sheets

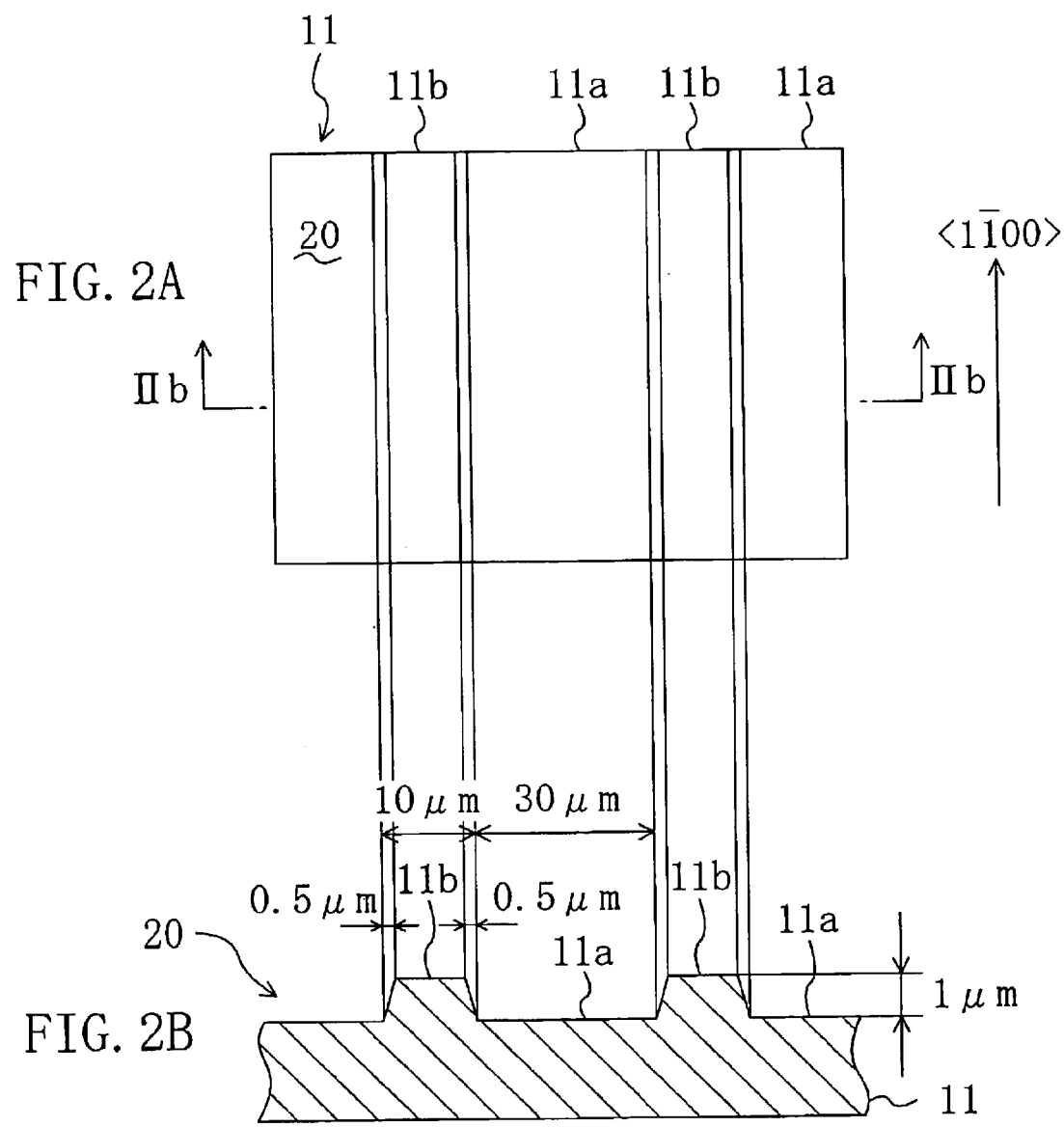

METHOD OF MANUFACTURING NITRIDE SEMICONDUCTOR SUBSTRATE

BACKGROUND OF THE INVENTION

The present invention relates to a method of manufacturing a nitride semiconductor substrate for use in a visible light emitting diode or a blue violet laser.

Group III-V nitride semiconductor such as gallium nitride (GaN), indium nitride (InN) and aluminum nitride (AlN) is preferably used as a compound semiconductor material used for a blue or green light emitting diode (LED), a blue semiconductor laser or a high speed transistor device capable of operating at a high temperature.

There is for example a well-known insulating substrate of sapphire to grow nitride semiconductor thereon as disclosed by Japanese Patent No. 3091593.

However, it is known that if a layer of nitride semiconductor is grown on a substrate of a material having a different composition from the nitride semiconductor such as sapphire, the difference between the thermal expansion coefficients of the nitride semiconductor to grow and the substrate thereunder causes the substrate to bow or have cracks. This degrades the crystallinity of the nitride semiconductor.

In recent years, there have been attempts to solve the problem related to the difference in the materials of the substrate and the layer grown thereon by forming the substrate with nitride semiconductor and forming an element structure of the same kind of nitride semiconductor thereon.

According to one such method of manufacturing a nitride semiconductor substrate, a nitride semiconductor layer is grown to have a relatively large thickness on a substrate to be a base member (base substrate), and a laser beam is irradiated on the interface between the grown nitride semiconductor layer and the base substrate. According to the proposed method, the nitride semiconductor layer irradiated with the laser beam is locally heated to be sublimed, and separated from the base substrate, so that a nitride semiconductor substrate may be provided from the nitride semiconductor layer.

According to the conventional method of manufacturing the nitride semiconductor substrate, however, only the interface being irradiated with the laser beam between the nitride semiconductor layer and the base substrate is separated, while the other part remains connected. In this case, stress concentrates at the connected part of the nitride semiconductor layer and the base substrate, and cracks are generated in the nitride semiconductor layer. As a result, it would be difficult to manufacture the nitride semiconductor substrate with a high yield by irradiation of a laser beam at about a room temperature.

In order to avoid the disadvantage, there is a known method of irradiating a laser beam by raising a substrate temperature, but in the method, raising and lowering the substrate temperature takes much time, which is not highly productive either.

At the time of growing nitride semiconductor on a base substrate, threading defects caused by lattice mismatch are introduced into the nitride semiconductor, and a resulting nitride semiconductor substrate has a high defect density.

In addition, since the laser beam is condensed into a small beam diameter, the laser beam must be efficiently irradiated in order to separate the entire joined surfaces of the base material substrate and the nitride semiconductor layer. In order to sublime the nitride semiconductor, for example, the optical density of the laser beam should be about 0.1 J/cm$^2$ or higher, and the laser beam diameter is reduced in order to obtain the optical density. As a result, the beam diameter is small for the area of the substrate, and therefore the laser beam must be irradiated while the entire surface of the nitride semiconductor layer is scanned, which impairs the productivity from improving.

SUMMARY OF THE INVENTION

The present invention is directed to a solution to the above-described disadvantage associated with the conventional method. It is an object of the invention to surely provide a nitride semiconductor substrate free from cracks with a reduced defect density and allowing improved productivity.

In order to achieve the above-described object, according to the present invention, a main surface of a base substrate to grow a nitride semiconductor thereon is formed to have irregularities.

More specifically, a method of manufacturing a nitride semiconductor substrate according to the present invention includes a first step of selectively forming an irregular region on the main surface of the base substrate, a second step of growing a semiconductor layer of nitride on the irregular region in the base substrate so that a recessed portion in the irregular region is filled and the upper surface thereof is even, and a third step of irradiating an interface between the semiconductor layer and the base substrate with a laser beam, thereby separating the semiconductor layer from the base substrate to form a semiconductor substrate from the semiconductor layer.

By the method of manufacturing a nitride semiconductor substrate according to the present invention, an irregular region is formed on the main surface of the base substrate, and a semiconductor layer of nitride is then formed on the irregular region to fill the recessed part in the irregular region of the base substrate and make the upper surface even. Therefore, when a laser beam is irradiated upon the interface with the base substrate in the semiconductor layer afterwards, cracks or other breaks perpendicular to the substrate surface are not caused. This is because stress at the part irradiated with the laser beam is released as the part filling the recessed part of the base substrate in the semiconductor layer of nitride and the other part are cleaved parallel to the substrate surface.

In the method of manufacturing the nitride semiconductor substrate according to the present invention, in the third step, a laser beam is preferably irradiated upon at least the recessed portions in the irregular region. Thus, the entire semiconductor layer does not have to be scanned, which can reduce the time for laser beam irradiation, and improve the productivity.

In this case, in the first step, a plurality of grooves extending parallel to each other are preferably formed on the main surface of the base substrate. Meanwhile, in the third step, the laser beam is irradiated while scanning along the raised portions between the plurality of grooves in the base substrate. As a result, the recessed portions between the plurality of grooves are formed in a so-called stripe shape, so that the laser beam scanning can efficiently performed.

Also preferably, the base substrate is of sapphire whose main plane is in the {0001} plane orientation, and the direction of the zone axis of the grooves is in the <1-100> direction in the base substrate.

Also preferably in this case, in the first step, a plurality of island shaped raised portions are formed on the main surface of the base substrate, while in the third step, a pulsed laser beam is irradiated while scanning in synchronization with the plurality of raised portions in the base substrate. Thus, high output pulsed lasing can easily be performed, so that the semiconductor layer may easily be separated from the base substrate, which further improves the productivity.

Also preferably in this case, in the third step, a plurality of raised portions in the irregular region are irradiated at a time. The simultaneous irradiation upon the plurality of raised portions allows the irradiation time to be reduced, which surely improves the productivity.

In the method of manufacturing a nitride semiconductor substrate according to the present invention, in the first step, the area occupied by the recessed portions is preferably about 1/5 to about 100 times the area occupied by the raised portions in the irregular region in the base substrate. This surely prevents cracks or other breaks and the entire semiconductor layer can surely separated be from the base substrate.

In the method of manufacturing a nitride semiconductor substrate according to the present invention, in the third step, a laser beam is preferably irradiated from the surface opposite to the main surface of the base substrate.

Note that in the specification, instead of attaching a bar above a Miller index, the minus sign "−" precedes the index to indicate the inverse for the sake of convenience.

BRIEF DESCRIPTION OF THE DRAWINGS

FIGS. 2A and 2B show the method of manufacturing a nitride semiconductor substrate according to the first embodiment, wherein FIG. 2A is a plan view of an irregular region, and FIG. 2B is a sectional view taken along line IIb—IIb in FIG. 2A.

DETAILED DESCRIPTION OF THE INVENTION

[First Embodiment]

A first embodiment of the present invention will be now described in conjunction with the accompanying drawings.

FIGS. 1A to 1D through FIGS. 3A to 3D are sectional views showing a method of manufacturing a nitride semiconductor substrate according to the first embodiment of the present invention in the order of manufacturing steps.

Figure 1A:
FIGS. 1A to 1D are sectional views showing a method of manufacturing a nitride semiconductor substrate according to a first embodiment of the present invention in the order of steps.

As shown in FIG. 1A, a base substrate 11 of sapphire (mono-crystalline aluminum oxide) having a diameter of about 5.1 cm (2 in.) and a thickness of about 700 $\mu$m is prepared. The main surface of the base substrate 11 is in the (0001) plane orientation, and the main surface and the surface on the opposite side (backside surface) are both finished into a mirror surface.

Sapphire having a bandgap of 8.7 eV transmits light having a wavelength larger than 142.5 nm which is the wavelength of energy corresponding to the bandgap. Therefore, a KrF excimer laser beam having a wavelength of 248 nm or Nd: YAG laser, third harmonic light is transmitted through sapphire.

(Process of Working Base Substrate)

Figure 1B:
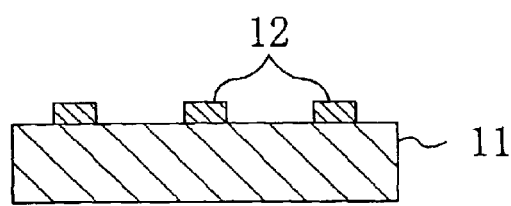

As shown in FIG. 1B, stripes of patterned resist 12 having a thickness of about 2 $\mu$m and a width of about 10 $\mu$m and arranged at an interval of about 30 $\mu$m are formed by photolithography on the main surface of the base substrate 11. The stripe direction at the time is in the zone axis direction of sapphire, the <1-100> direction.

Note that in this specification, the zone axis, the <1-100> direction indicates any one of the directions equivalent to the zone axis, the [1-100] direction and is not limited to one particular direction. For example, directions equivalent to the <1-100> direction are [1-100], [-1100], [01-10], [0-110], [10-10], and [-1010]. Similarly, the {1-100} plane indicates one of planes equivalent to the (1-100) plane in the plane orientation.

Figure 1C:
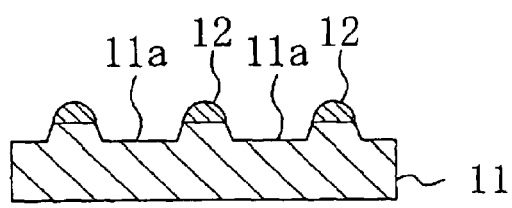

As shown in FIG. 1C, using the patterned resist 12 as a mask, the base substrate 11 is etched by Reactive Ion Etching (RIE). As the etching gas, a chlorine ($Cl_2$) gas is used, and plasma having an output value of about 200 W is generated under a pressure of about 5 Pa. After the etching for about one hour, stripe shaped recessed grooves 11a about as deep as 1 $\mu$m are formed.

Note that in the process, since plasma having an output of about 200 W is used, both sides of the patterned resist 12 are etched and rounded.

Figure 1D:
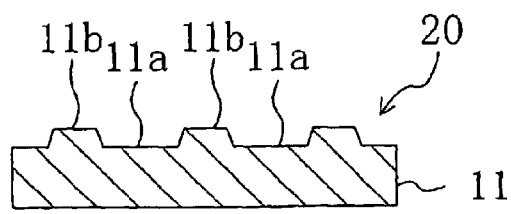

Then, as shown in FIG. 1D, the patterned resist 12 is removed, and the base substrate 11 having an irregular region 20 with raised and recessed portions on the main surface is provided.

Here, the irregular region 20 will be detailed by referring to FIGS. 2A and 2B.

FIG. 2A is a plan view of the irregular region 20, while FIG. 2B is a section taken along line IIb—IIb in FIG. 2A.

As shown in FIG. 2B, the width of the groove 11a is about 30 $\mu$m at the bottom, and the width of raised region 11b between the grooves 11a is about 10 $\mu$m in the lower part. Here, both sides of the raised region 11b is side-etched so that its upper part is smaller than the lower part each by about 0.5 $\mu$m.

As shown in FIG. 2A, the direction in which the groove 11a or the raised region 11b extends is the direction of the zone axis of sapphire, the <1-100> direction. Hereinafter, the direction in which the raised region 11b extends is referred to as "the stripe direction."

(Process of Growing Nitride Semiconductor)

Figure 3A:
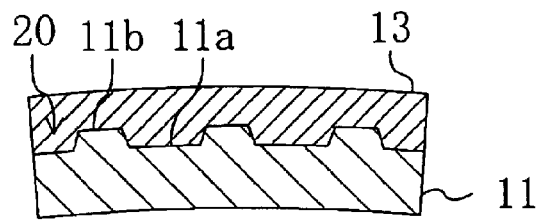
FIGS. 3A to 3D are sectional view showing the method of manufacturing a nitride semiconductor substrate according to the first embodiment.

As shown in FIG. 3A, by Hydride Vapor Phase Epitaxy (HVPE) using a group III source, gallium chloride (GaCl), and a group V source, ammonia (NH$_3$), a semiconductor layer 13 of gallium nitride (GaN) is formed on the irregular region 20 of the base substrate 11. The gallium chloride as the group III source is produced by allowing metallic gallium (Ga) and hydrogen chloride (HCl) to react at about 900° C. under atmospheric pressure.

In order to increase the nucleation density of the gallium nitride on the main surface of the base substrate 11, the substrate temperature is kept at about 1000° C. and only gallium chloride is supplied for about 15 minutes before growing the semiconductor layer 13. (Hereinafter the process will be referred to as "GaCl process.") Note that in order to increase the nucleation density, a so-called low temperature buffer layer may be provided in place of the GaCl process. The low temperature buffer layer consists of gallium nitride and is grown on the base substrate 11 at a relatively low temperature about in the range from 400° C. to 800° C. Alternatively, the main surface of the base substrate 11 may be nitrided using ammonia. The use of the low buffer layer and the nitriding process may be combined.

How the semiconductor layer 13 is grown will be detailed.

After the GaCl process, gallium chloride and ammonia are introduced onto the base substrate 11, and the semiconductor layer 13 of gallium nitride starts to be grown. Here, the main surface of the base substrate 11 is in the (0001) plane orientation, and therefore the semiconductor layer 13 is grown with the (0001) plane as the main surface. At a growth temperature of about 1000° C., the growth rate in another plane, i.e., on the side of the raised region 11b is greater than the growth rate on the (0001) plane. As a result, the growth rate in the direction parallel to the substrate surface, in other words, the growth rate in the transverse direction is about twice to three times as high, and therefore the groove 11a is gradually filled. In order to completely fill the groove 11a, the thickness of the semiconductor layer 13 is preferably equal or greater that the width of the groove 11a.

The stripe direction is in the <1-100> direction, the direction of the zone axis of sapphire forming the base substrate 11, and the sapphire and the gallium nitride grow 30° shifted from one another in the plane orientation within the planes. Therefore, the part on the side of the groove 11a in the gallium nitride when the groove 11a is filled has the even {1-101} plane. Therefore, if the semiconductor layer 13 continues to grow, the groove 11a is filled into evenness free from any defects such as pits. Then, after the groove 11a is filled, the semiconductor layer 13 is grown to have a thickness of about 200 μm on the raised region 11b. Thus, the groove 11a at the irregular region 20 is filled by the semiconductor layer 13, so that the surface of the semiconductor layer 13 is even. Thereafter, when the substrate temperature is lowered to the vicinity of the room temperature, the difference between the thermal expansion coefficients of the semiconductor layer 13 and the base substrate 11 causes the substrate 11 to bow as shown in FIG. 3A.

According to the first embodiment, as compared to the case in which the base substrate 11 and the semiconductor layer 13 are joined as they are planes, the base substrate 11 having an irregular surface bows less. For example, it has been confirmed that the radius of curvature in the stripe direction was about 80 cm, and the radius of curvature in the direction perpendicular to the stripe direction within the substrate plane was about 1 m. Note that for the purpose of comparison, when the semiconductor layer 13 was grown without providing the irregular region 20 on the main surface of the base material substrate 11, the radius of curvature of the base substrate 11 was about 60 cm.

(Process of Laser Beam Irradiation)

Figure 4:
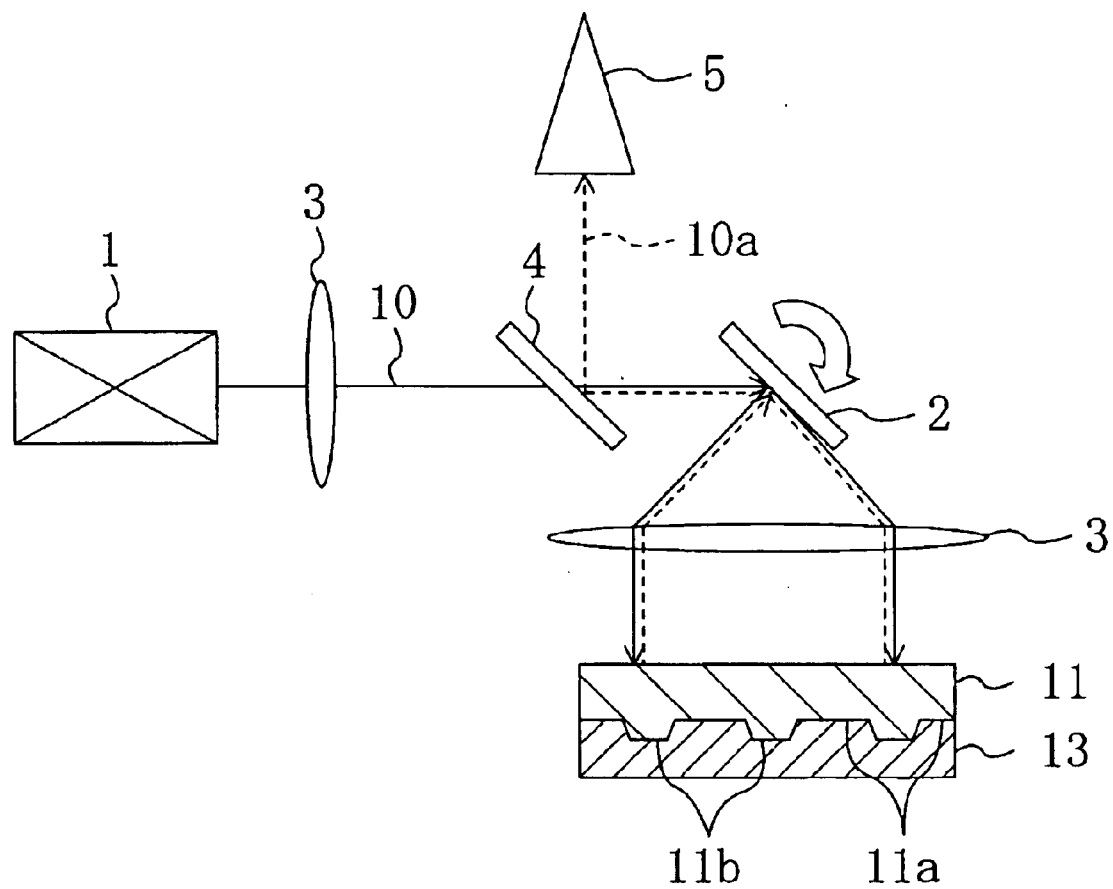
FIG. 4 is a schematic view showing a laser for use in the method of manufacturing a nitride semiconductor substrate according to the first embodiment.

A laser beam is irradiated upon the semiconductor layer 13 using a laser as shown in FIG. 4.

As shown in FIG. 4, a laser beam 10 emitted from a laser emission portion 1 is scanned two-dimensionally by a scan lens 2 and irradiated upon the semiconductor layer 13. Here, the laser beam 10 is irradiated upon the semiconductor layer 13 from the surface opposite to the main surface of the base substrate 11. The beam diameter of the laser beam 10 on the semiconductor layer 13 can be adjusted using a plurality of condenser lenses 3 placed on the optical path of the laser beam 10. Furthermore, the laser includes a mirror 4 having high transmittance to the laser beam 10 and high reflectance to visible light, and an image recognizing portion 5 receiving visible light 10a input through the mirror 4. The image recognizing portion 5 recognizes the laser irradiation position in the semiconductor layer 13 using the input visible light 10a and controls the rotation position of the scan lens 2.

According to the first embodiment, an Nd: YAG, third harmonic having a wavelength of 355 nm is used for the laser beam source. The pulse width is about 30 ns, while the pulse cycle is about 50 kHz. The laser beam 10 is condensed into a circular beam having a diameter of about 20 μm, so that an optical density of about 1.0 J/cm$^2$ results. Since sapphire is transparent to the laser beam 10, the beam is irradiated upon the semiconductor layer 13 through the base substrate 11 from the backside surface of the substrate 11 as described above.

When the laser beam 10 is irradiated, the condenser lens 3 is preferably adjusted so that the spot diameter of the laser beam 10 is constant, because the base substrate 11 and the semiconductor layer 13 both bow.

According to the first embodiment, the laser beam 10 is selectively irradiated along the interface between the semiconductor layer 13 and the raised region 11b. In order to continuously irradiate the laser beam 10 along the interface between the raised region 11b and the semiconductor layer 13, the scanning speed of the laser beam 10 is set to 50 cm/s. At the time, the interval of the centers of adjacent irradiation positions in the scanning direction on the raised regions 11b is about 10 μm. Therefore, the interval of the centers of the irradiation positions is smaller than the beam diameter of the laser beam 10 which is about 20 μm, and therefore even pulsed irradiation can achieve continuous irradiation along the interface between the semiconductor layer 13 and the base substrate 11. In addition, the scanning is not stopped during the pulsed irradiation, in other words, if the irradiation is performed while the optical axis is scanning, the laser beam 10 can be continuously irradiated upon the semiconductor layer 13.

Figure 3B:
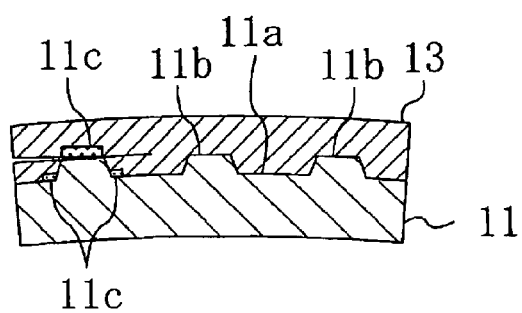

FIG. 3B is a sectional view of the base substrate 11 during the process of irradiation in progress.

The semiconductor layer 13 absorbs the laser beam and is heated. The pulse width of the laser beam is as short as 30 ns, the optical density is large, and therefore the part of the semiconductor layer 13 irradiated with the laser beam is locally heated. The heating causes the part irradiated with the laser beam in the semiconductor layer 13 of the gallium nitride to be thermally decomposed to generate a gallium layer 11c and a nitrogen gas.

Note that according to the first embodiment, the beam diameter of the laser beam is larger than the width of the raised region 11b, and therefore the gallium layer 11c is generated partly at the bottom of the groove 11a.

The gallium layer 11c is in a liquid state at a temperature of 25° C. or higher, and still very soft at a temperature below that, and therefore the binding force between the base substrate 11 and the semiconductor layer 13 through the gallium layer 11c is very small. As a result, stress caused by the thermal expansion coefficient difference concentrates at the joining part of the base substrate 11 and the semiconductor layer 13.

The nitrogen gas is generated by thermal decomposition of the semiconductor layer 13, and therefore the pressure is extremely high because of the nitrogen gas present in the thermally decomposed region of the semiconductor layer 13 and it vicinity.

According to the first embodiment, there is an irregular region 20 having raised and recessed portions on the main surface of the base substrate 11, and the semiconductor layer 13 of gallium nitride is grown on the irregular region 20. Now, the stress applied upon the semiconductor layer 13 at the time will be described in conjunction with FIG. 5.

When a semiconductor layer is grown on the even main surface of the base substrate similarly to the conventional case, stress caused by the thermal expansion coefficient difference is applied on the entire interface between the base substrate and the semiconductor layer.

According to the first embodiment, the stress concentrates at the region 30 connecting the upper surfaces of the adjacent raised region 11b of the base substrate 11 in the semiconductor layer 13. Furthermore, since the semiconductor layer 13 has a small thermal expansion coefficient, the presence of the base substrate 11 having a greater thermal expansion coefficient the semiconductor layer 13 at the interface causes first stress 31 in the direction of expansion. Meanwhile, the base substrate 11 generates second stress 32 in the direction of contraction. Thus, the region of the semiconductor layer 13 filling the groove 11a of the base substrate 11 contracts. As a result, the first stress 31 and the second stress 32 act to cut the semiconductor layer 13 from the upper surface of the raised region 11b in the semiconductor layer 13 in the direction parallel to the main surface.

Figure 5:
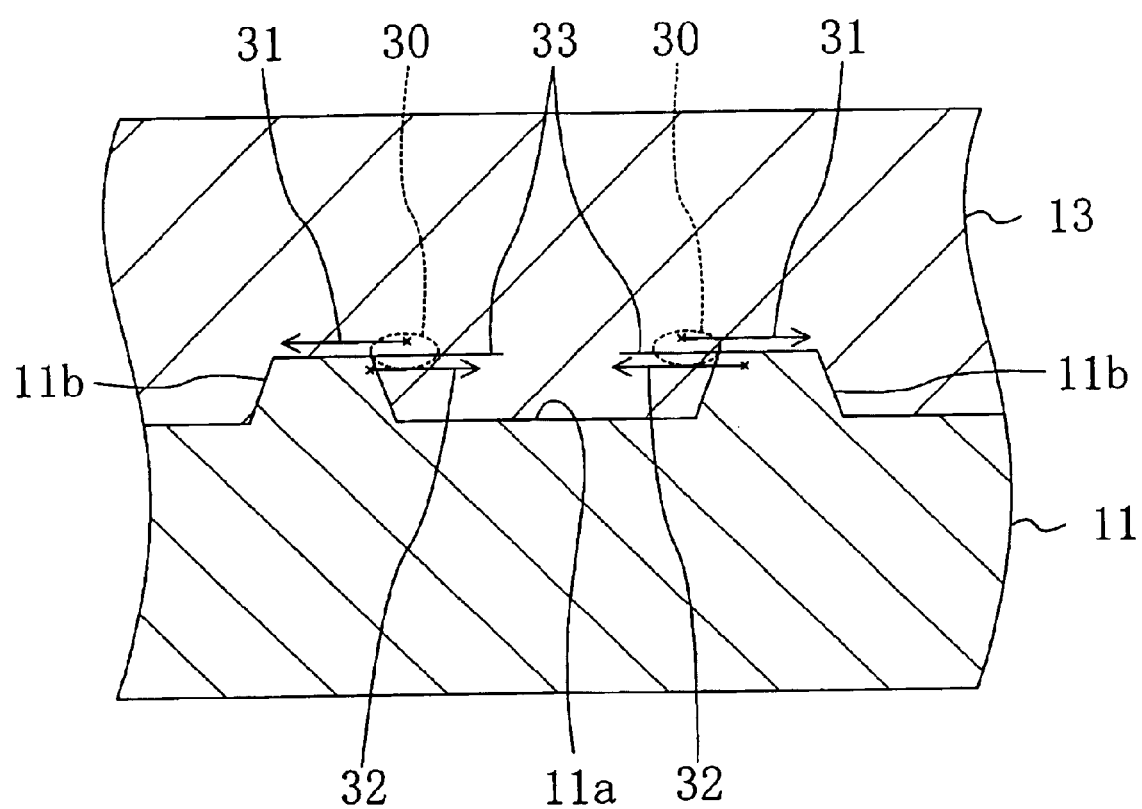
FIG. 5 is a schematic sectional view showing stress caused at the interface between the base substrate and the semiconductor layer in the method of manufacturing a nitride semiconductor substrate according to the first embodiment.

Note that as shown in FIG. 5, the first stress 31 and the second stress 32 could cause cracks 33 parallel to the substrate surface in the semiconductor layer 13. Note however that after the growth, the semiconductor layer 13 and the base substrate 11 are joined in the raised region 11b of the base substrate 11, and therefore the semiconductor layer 13 is not easily cut.

Therefore, the laser beam irradiation causes the interface between the semiconductor layer 13 and the raised region 11b of the base substrate 11 to thermally decompose, while the first stress 31 and the second stress 32 and the force of the nitrogen gas caused by the thermal decomposition pressing the semiconductor layer 13 concentrate at the upper part of the groove 11a in the semiconductor layer 13. In addition, the main surface of the semiconductor layer 13 of the gallium nitride is in the (0001) plane orientation, and therefore the layer tends to be easily cleaved in a plane parallel to the main surface.

As a result, when the semiconductor layer 13 is thermally decomposed on the upper side of the raised region 11b of the base substrate 11 by the laser beam irradiation, the stress is applied to the upper part of the groove 11a of the base material substrate 11 in the semiconductor layer 13, and the semiconductor layer 13 is cleaved along the (0001) plane of the gallium nitride forming the semiconductor layer 13 at the upper part of the groove 11a. At the same time, the high pressure nitrogen gas is diffused by the cleavage of the semiconductor layer 13 at the upper part of the groove 11a.

As will be described, when the area ratio of the recess and raised portions in the irregular region 20 in the base substrate 11 is optimized, at least half the area of the semiconductor layer 13 filling the groove 11a is cleaved by a single laser beam irradiation operation to the raised region 11b of the base substrate 11. As a result, as the laser beam irradiation to each raised region 11b is repeated, the part of the semiconductor layer 13 filling the grooves 11a can completely be removed (separated) from the base substrate 11.

Note that according to the first embodiment, since the laser beam is irradiated perpendicularly upon the main surface of the substrate through the base substrate 11 having the irregular region 20, the irradiation intensity is lower on the side of the raised region 11b, and the semiconductor layer 13 is not completely thermally decomposed there.

As in the foregoing, the second stress 32 on the upper part of the raised region 11b of the base substrate 11 plays an important role in separating the semiconductor layer 13. Meanwhile, the thermal decomposition on the side of the raised region 11b does not much contribute to the separation. The semiconductor layer, if anything, joined rather than separated more effectively allow the second stress 32 generated at the upper part of the raised region 11b to be concentrated. As a result, the angle of the side of the raised region 11b with respect to the substrate surface is preferably as close as to the right angle, and should be 30° or more.

Using this mechanism of separation, it was confirmed that there was no cracks extending perpendicularly to the main surface of the base substrate 11 in the semiconductor layer 13 during laser beam irradiation.

Figure 3C:
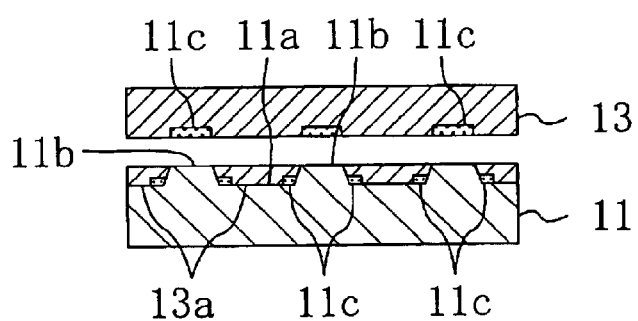

Therefore, as shown in FIG. 3C, a laser beam may be irradiated upon the entire interface between the semiconductor layer 13 and the raised region 11b, so that the semiconductor layer 13 is separated from the base substrate 11 while the remaining part 13a of the semiconductor layer 13 is left at the groove 11a of the base substrate 11.

Figure 3D:

As shown in FIG. 3D, the gallium layer 11c is removed by hydrogen chloride, and then the irregular part of the joining surface with the base substrate 11 in the semiconductor layer 13 is removed away by polishing. A nitride semiconductor substrate 13A is thus provided from the semiconductor layer 13 of the gallium nitride. The nitride semiconductor substrate 13A at the time has a diameter of about 5.1 cm (2 in.) and a thickness of about 180 $\mu$m. The substrate is in a bulk state without cracks or chipping parts in the periphery.

As in the foregoing, according to the first embodiment, only the interface between the semiconductor layer 13 and the raised region 11b of the base substrate 11 is selectively irradiated with a laser beam, the time for laser beam irradiation can be reduced as compared to the conventional case of irradiating the entire surface of the semiconductor layer 13. This can improve the throughput in the process of laser beam irradiation.

According to the first embodiment, the total area of the raised regions 11b in the base substrate 11 is ¼ of the area of the substrate, and therefore the time for the laser beam irradiation can be at least reduced to ¼ of that of the conventional case. In reality, when the entire substrate is irradiated, the laser beam is irradiated partly again on the already irradiated position, and therefore the time for irradiation according to the embodiment is ¼ or less.

More specifically, when a laser beam having a beam diameter of 20 $\mu$m is irradiated so that the irradiation positions overlap by 10 µm, the irradiation is completed in about four minutes to the semiconductor layer 13 having a diameter of two inches. Meanwhile, if the beam is irradiated on the entire surface of the semiconductor layer 13 so that the irradiation positions overlap by 10 µm, the process of laser beam irradiation takes about as long as 30 minutes.

According to the first embodiment, since the raised region 11b of the base substrate 11 extends in a stripe shape on the irregular region 20, scanning of the optical axis of the laser beam can be simplified, which allows efficient irradiation.

Figure 6:
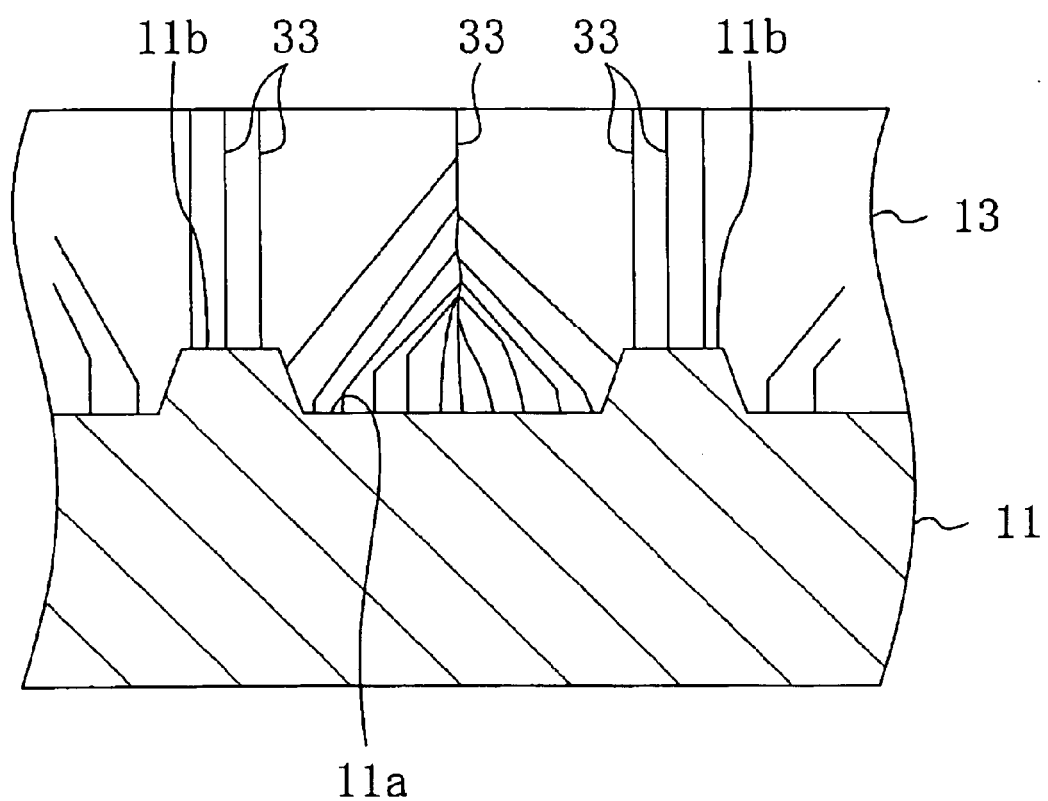
FIG. 6 is a schematic sectional view showing threading defects caused in the semiconductor layer grown on the base substrate in the method of manufacturing a nitride semiconductor substrate according to the first embodiment.

Also according to the first embodiment, the semiconductor layer 13 of gallium nitride is filled on the base substrate 11 having the irregular region 20 on the main surface. Therefore, as shown in FIG. 6, threading defects 33 extend toward the vicinity of the center of the groove 11a from the upper part of the groove 11a of the base substrate 11 in the semiconductor layer 13, and a number of these threading defects 33 are coupled with one another to reduce the number of the threading defects 33. As a result, the density of the threading defects on the surface of the semiconductor layer 13 is about $1 \times 10^6$ cm$^{-2}$ on the upper part of the groove 11a.

As a result, when a device is formed using the resulting nitride semiconductor substrate 13A, the functional portions of the device are preferably provided in the region with less threading defects 33. Note that the threading defects 33 in regions other than the groove 11a can be reduced by providing a recess on the raised region 11b in the semiconductor layer 13 to form another irregular region, and again growing gallium nitride on the newly formed irregular region.

Meanwhile, the defect density of the conventional semiconductor layer of gallium nitride grown on the substrate of sapphire is about $1 \times 10^9$ cm$^{-2}$.

Thus, according to the first embodiment, the laser beam irradiation time can be reduced to ¼ or less, which is significant reduction, and the nitride semiconductor substrate 13A having a reduced defect density can surely be provided.

Note that according to the first embodiment, the RIE method is employed as a method of forming the irregular region 20 on the main surface of the base substrate 11, while the method is not particularly limited to this and other conditions and methods such as ion milling or ECR etching may be employed for forming the irregular region 20. Further, physical means such as sand blasting, polishing may be used, or a deposition method such as selective growth may be used.

In addition, in a case that the base substrate 11 has a multilayer structure, it suffices to form the irregular region 20 in the surface portion of at least one layer thereof.

Also according to the first embodiment, the depth of the groove 11a of the base substrate 11 is about 1 µm, while too small a depth reduces stress (second stress 32) to be applied on the semiconductor layer 13 filling the groove 11a, and the semiconductor layer 13 is less easily cleaved along the (0001) plane. As a result, the depth of the groove 11a is preferably large, at least 0.1 µm.

Also according to the embodiment, the stripe direction is in the direction of the zone axis of sapphire, the <1-100> direction. Meanwhile, depending upon the material used for the base substrate 11, the relation in the plane orientation between the base substrate 11 and the semiconductor layer 13 of gallium nitride may be different. In this case, the direction of the zone axis of the gallium nitride, the <11-20> direction is preferably in the stripe direction. For example, if silicon carbide (SiC) or aluminum nitride (AlN) is used for the base substrate 11, the plane orientations of the base substrate 11 and the gallium nitride are in coincidence, and therefore the stripe direction is preferably set in the direction of the zone axis of the nitride gallium, the <11-20> direction.

According to the first embodiment, the growth temperature of the semiconductor layer 13 is about 1000° C., while there is a preferable range of temperature for filling the groove 11a in the base substrate 11 into evenness, and the temperature is preferably at least 900° C. The groove 11a is more easily filled at higher temperatures. However, at an extremely high temperature, the sublimation becomes dominant over the growth of the gallium nitride, and the semiconductor layer 13 stops growing. Therefore, in the growth conditions according to the first embodiment, the growth temperature is preferably not more than 1500° C.

Also according to the first embodiment, the width of the groove 11a in the base substrate 11 is about 30 µm, and the width of the raised region 11b is about 10 µm. There is a preferable range of the area ratio of the recess and raised portions. More specifically, the upper limit for the area occupied by the width of the groove 11a is defined within the range in which cleavage is generated along the (0001) plane in the plane orientation of the gallium nitride by irradiation only upon the raised region 11b, and the entire semiconductor layer 13 is separated from the base substrate 11. As a result, the area occupied by the width of the groove 11a is preferably not more than about 100 times the area occupied by the width of the raised region 11b. Meanwhile, if the width of the groove 11a is extremely small, stress (second stress 32) caused at the time of laser beam irradiation is not released, and therefore cracks perpendicular to the surface of the substrate are generated in the semiconductor layer 13, and the nitride semiconductor substrate 13A as desired does not result. Therefore, the area occupied by the width of the groove 11a is preferably at least one fifth of the area occupied by the width of the raised region 11b.

Also according to the first embodiment, the optical density of the laser beam is 1.0 J/cm$^2$, and the optical density of the laser beam has its lower limit. In other words, the optical density enough for decomposing the semiconductor layer 13 is necessary. The optical density necessary for decomposing the gallium nitride is about 0.1 mJ/cm$^2$ or higher if the semiconductor layer 13 is directly irradiated. By the time the laser beam reaches the semiconductor layer 13, the incident laser beam would be reduced by some dozen percents by reflection and scattering at the surface of the base substrate 11 and at the interface between the base substrate 11 and the semiconductor layer 13.

Also according to the first embodiment, the raised regions 11b are arranged in a stripe pattern, while any other linearly continuous pattern may be preferably employed to simplify the scanning of the optical axis of the laser beam. Furthermore, a helix-like, single-stroke pattern is preferably used, because the entire semiconductor layer 13 can be irradiated with a laser beam by a single scanning step. Note that in the case, the side of the pattern of the raised regions 11b is preferably provided to match the {1-101} plane of the gallium nitride.

According to the first embodiment, the patterned resist 12 is used as an etching mask, the mask material is not limited to the resist, and any other material may be used unless the etching selective ratio of the material to sapphire is extremely small. For example, in place of the resist, a dielectric film of silicon oxide (SiO$_2$), silicon nitride (SiN) or the like, or a metal film of nickel (Ni), gold (Au) or tungsten (W) may be used.

[Second Embodiment]

A second embodiment of the present invention will be now described in conjunction with the accompanying drawings.

FIGS. 7A to 7C through FIGS. 9A to 9C are sectional views showing a method of manufacturing a nitride semiconductor substrate according to the second embodiment of the present invention in the order of steps.

According to the second embodiment, raised portions in the irregular region 20 are arranged in a dot pattern instead of the stripe pattern. Here, the same elements as those according to the first embodiment are denoted by the same reference characters.

Figure 7A:
FIGS. 7A to 7C are sectional views showing a method of manufacturing a nitride semiconductor substrate according to a second embodiment of the present invention in the order of steps.

As shown in FIG. 7A, a base substrate 11 of sapphire having a diameter of about 5.1 cm (2 in.) and a thickness of about 700 $\mu$m is prepared. The main surface of the base substrate 11 is in the (0001) plane orientation, and the main surface and the opposite surface (backside surface) are both finished into a mirror surface.

(Process of Working Base Substrate)

Figure 7B:
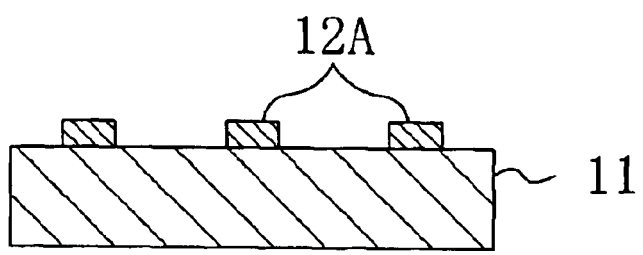

As shown in FIG. 7B, patterned resist 12A having a dot pattern is formed on the main surface of the base materials substrate 11 by photolithography. In the dot pattern, each dot has a diameter of 10 $\mu$m and the interval between the central positions of adjacent dots is about 30 $\mu$m.

Figure 8:
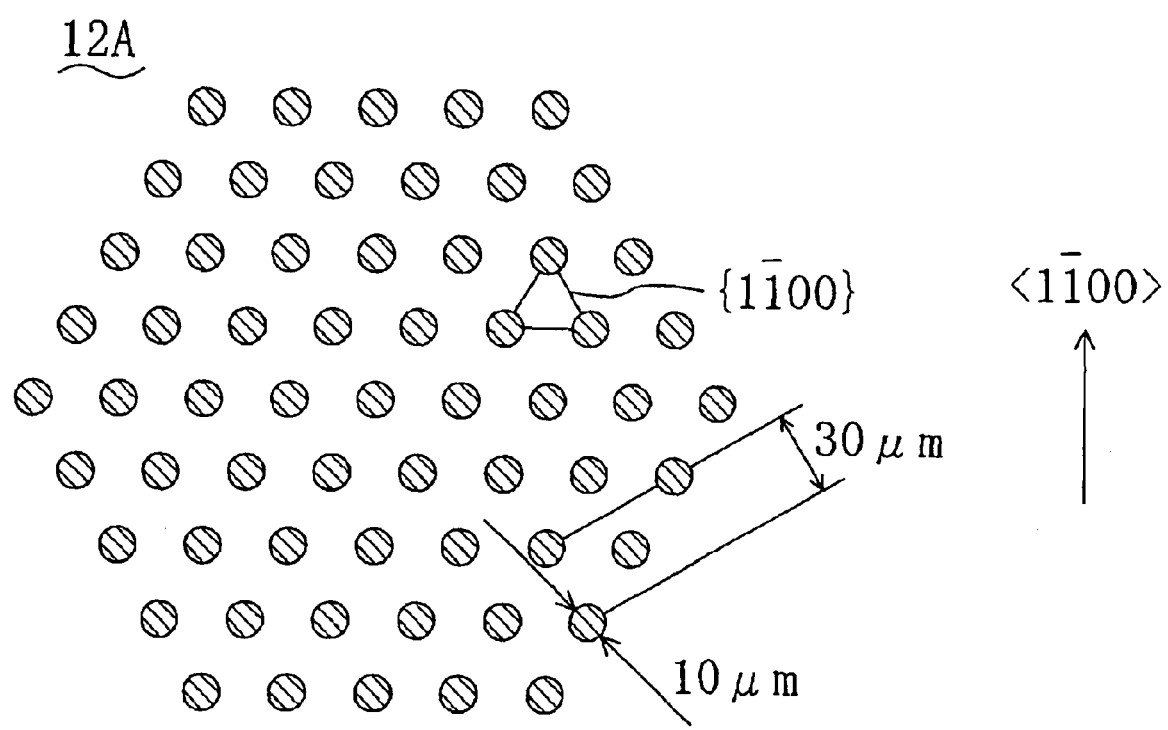
FIG. 8 is a plan view showing patterned resist for forming a dot pattern in the method of manufacturing a nitride semiconductor substrate according to the second embodiment.

As shown in the plan view in FIG. 8, assuming that regular triangles having a side of 30 $\mu$m are placed in the close-packed manner, dots in the patterned resist 12A are positioned at the apexes of the triangles. One side of the regular triangle at the time is patterned to be in the sapphire {1-100} plane orientation. Note that if there are incomplete dots in the periphery of the base substrate 11, the semiconductor layer 13 might not grow well, and therefore dots are not provided in the periphery of the base substrate 11.

Figure 7C:
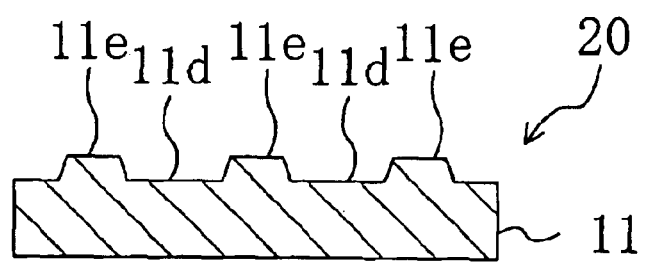

Then as shown in FIG. 7C, the base substrate 11 is etched using the patterned resist 12A as a mask by RIE method in the conditions equivalent to the first embodiment, and a low portion 11d at a depth of about 1 $\mu$m from the main surface of the base material member 11 is formed. The patterned resist 12A is then removed away, so that a plurality of raised portion 11e in the dot pattern transferred from the pattern of the resist 12A are formed. The raised portion 11e has a section in a shape substantially identical to that shown in FIG. 2B and has a width of about 10 $\mu$m. Side etching is performed so that the diameter of the raised portion 11e on the side at the upper part is smaller than the lower part by about 0.5 $\mu$m. The interval between the central positions of adjacent raised portions 11e is about 30 $\mu$m.

(Process of Nitride Semiconductor Growth)

Figure 9A:
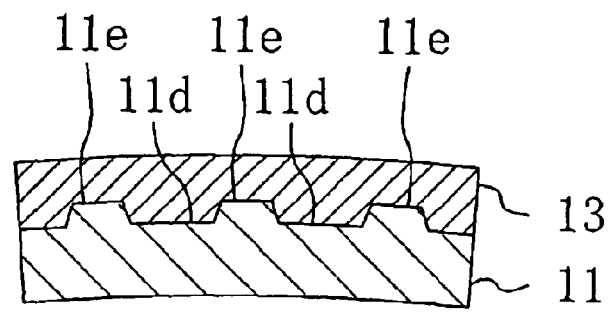
FIGS. 9A to 9C are sectional views showing the method of manufacturing a nitride semiconductor substrate according to the second embodiment in the order of steps.

Then, as shown in FIG. 9A, a semiconductor layer 13 of gallium nitride is grown on the irregular region 20 of the base substrate 11 in the conditions identical to the first embodiment by HVPE method using ammonia and gallium chloride as materials.

The two-dimensional shape of the raised portion 11e is a dot shape, while the growth rate of the {1-101} plane of gallium nitride is relatively low, and therefore the side of raised portion 11e is covered by the gallium nitride surrounded by six {1-101} planes and the (0001) plane of the main plane when the semiconductor layer 13 is grown to have a thickness of about 1 $\mu$m. In addition, since the arrangement of the raised portions 11e are as shown in FIGS. 7C and 8, gallium nitride extended from adjacent raised portions 11e are combined at the {1-101} plane and the low portion 11d is filled into evenness. After the low portion 11d is filled with the semiconductor layer 13, the semiconductor layer 13 is grown to have a thickness of about 200 $\mu$m on the upper side of the raised portion 11e. Thus, the low portion 11d in the irregular region 20 is filled with the semiconductor layer 13 and the semiconductor layer 13 has an even surface. Then, when the substrate temperature is lowered to the vicinity of the room temperature, the thermal expansion coefficient difference between the semiconductor layer 13 and the base substrate 11 causes the substrate 11 to bow as shown in FIG. 9A. The bow caused at the time depends little on the direction on the substrate surface and the radius of curvature is about 1 m.

(Process of Laser Beam Irradiation)

According to the second embodiment, a laser as shown in FIG. 4 is used. The irradiation conditions are the same. For example, the beam diameter of a laser beam is about 20 $\mu$m, while the pulse cycle of the laser beam emission is about 50 kHz. At the time, the diameter of the raised portion 11e is about 10 $\mu$m which is smaller than the beam diameter of about 20 $\mu$m, and therefore a single raised portion 11e can be irradiated by a single pulsed irradiation operation.

According to, the second embodiment, the laser beam is irradiated while the emitting cycle is in synchronization with the positions of the raised portions 11e. More specifically, the distance between the central positions of adjacent raised portions 11e is about 30 $\mu$m as described above, and the pulse frequency is 50 kHz. Therefore, if the scanning speed is 150 cm/s, pulsed irradiation can be performed in synchronization with a series of raised portions 11e arranged in a row. At the time, the positional information from the image recognizing portion 5 as shown in FIG. 4 is fed back to the scan lens 2, and the irradiation position is preferably fine-adjusted in irradiation.

As described above, the semiconductor layer 13 absorbs an irradiated laser beam and is heated. Since the pulse width of the laser beam is about as short as 30 ns and the optical density is large, the part of the semiconductor layer 13 irradiated with the laser beam is locally heated. By the heating, the part of the semiconductor layer 13 irradiated with the laser beam is thermally decomposed and a gallium layer 11c and a nitrogen gas result.

According to the second embodiment, the low portion 11d is formed in the periphery of the raised portion 11e of the base substrate 11 at which the laser beam is irradiated, and therefore the same effect as that by the first embodiment can be provided. More specifically, the laser beam irradiation thermally decomposes the part in the vicinity of the raised portion 11e in the semiconductor layer 13, then stress to cause the upper part of the raised portion 11e to contract is released as the part above the low portion 11d in the semiconductor layer 13 is cleaved in the (0001) plane in the plane orientation of gallium nitride. In addition, the high pressure nitrogen gas generated by the thermal decomposition is diffused as the semiconductor layer 13 is separated from the base substrate 11.

According to the second embodiment, this separation mechanism prevents cracks extending perpendicularly to the main surface of the base substrate 11 in the semiconductor layer 13 during the laser beam irradiation.

Figure 9B:
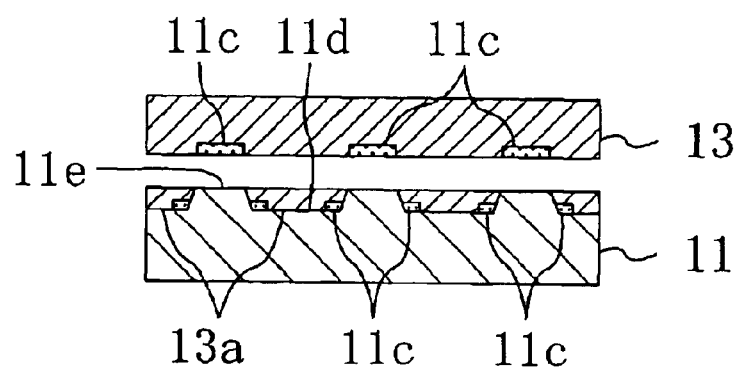

As a result, as shown in FIG. 9B, a laser beam is irradiated upon the entire interface between the semiconductor layer 13 and the raised portion 11e, so that the semiconductor layer 13 can be separated from the base substrate 11, while the remaining portion 13a of the semiconductor layer 13 is left on the low portion 11d of the base material substrate 11.

Figure 9C:

Then, as shown in FIG. 9C, the gallium layer 11c is removed away using hydrogen chloride, and then the irregular part of the joining surface of the semiconductor layer 13 with the base substrate 11 is removed away by polishing.

The nitride semiconductor substrate 13A is thus obtained from the semiconductor layer 13 of gallium nitride. At the time, the nitride semiconductor substrate 13A has a diameter of about 5.1 cm (2 in.) and a thickness of about 180 μm with no cracks or incomplete parts in the periphery and is in a bulk state.

As in the foregoing, according to the second embodiment, a laser beam is selectively irradiated only on the interface between the semiconductor layer 13 and the raised portion 11e, and therefore as compared to the case of irradiating the beam on the entire surface of the semiconductor layer 13, the time for laser beam irradiation can be reduced, so that the throughput in the process of the laser beam irradiation can be improved.

Furthermore, since the dot-shaped, raised portions 11e are distributed, a single laser pulse can be irradiated upon a single raised portion 11e, so that the interface between the semiconductor layer 13 and the raised portion 11e is locally heated and removed. As a result, the laser beam irradiation positions do not have to overlap, so that the time for laser beam irradiation can be shorter than that according to the first embodiment.

More specifically, according to the second embodiment, using a laser beam having a beam diameter of about 20 μm, the laser beam irradiation can be completed only in about one and half minutes to the semiconductor layer 13 having a diameter of two inches. Meanwhile, according to the conventional irradiation method as described above, the process of the laser beam irradiation takes about 30 minutes. Therefore, the manufacturing method according to the second embodiment can significantly shorten the time for the laser beam irradiation process.

Also according to the second embodiment, the raised portions 11e are provided in a periodic dot pattern, which simplifies the scanning of the optical axis of the laser beam, and therefore the laser beam can effectively be irradiated.

Also according to the second embodiment, the semiconductor layer 13 of gallium nitride is filled and grown on the main surface of the base substrate 11 having the irregular region 20, and therefore the threading defect density on the surface of the semiconductor layer 13 is about $1 \times 10^6$ cm$^{-2}$ on the part above the low portion 11d.

As descried above, according to the second embodiment, the time for laser beam irradiation to the semiconductor layer 13 can significantly be reduced to about one and half minutes, and the nitride semiconductor substrate 13A having a region with a significantly reduced defect density results.

Note that according to the second embodiment, the two-dimensional shape of the raised portion 11e is circular, while the shape can be any shape as long as it is within the beam diameter of the laser beam.

As shown in FIG. 8, the arrangement pattern of the raised portions 11e is preferably such that the direction of the side on which the raised portion 11e is provided is in the {1-101} plane orientation of the gallium nitride.

In addition, according to the second embodiment, each raised portion 11e is positioned at the apex of a triangle when regular triangles are provided in the close-packed manner, while any other pattern may be employed to reduce the area to be irradiated with a laser beam and thus shorten the laser beam irradiation process.

Further in this case, as described above, the raised portions 11e are preferably arranged so that the {1-101} planes of the growing gallium nitride are combined. More preferably in this case, the raised portions 11e are periodically arranged so that the scanning of the optical axis of the laser beam is simplified.

[Third Embodiment]

A third embodiment of the present invention will be now described in conjunction with the accompanying drawings.

FIGS. 10A to 10C and FIGS. 11A to 11C are sectional views showing a method of manufacturing a nitride semiconductor substrate according to a third embodiment of the present invention in the order of steps.

The third embodiment employs a different method of irradiating a laser beam to the dot pattern forming the irregular region 20 in the base substrate. Here, the same elements as those according to the second embodiment are denoted by the same reference characters.

Figure 10A:
FIGS. 10A to 10C are sectional views showing a method of manufacturing a nitride semiconductor substrate according to a third embodiment of the present invention in the order of steps.

As shown in FIG. 10A, a base substrate 11 of sapphire having a diameter of about 5.1 (2 in.) and a thickness of about 700 μm is prepared. The main surface of the base substrate 11 is in the (0001) plane orientation, and the main surface and the opposite surface (backside surface) are both finished into a mirror surface.

(Process of Working Base Substrate)

Figure 10B:
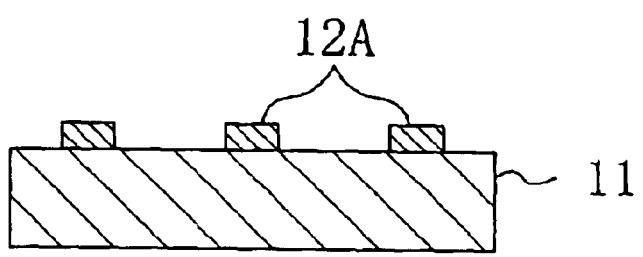

As shown in FIG. 10B, patterned resist 12A having a dot pattern is formed on the main surface of the base substrate 11. In the pattern, each dot has a diameter of about 10 μm and the distance between the central positions of adjacent dots is about 30 μm. The two-dimensional shape of the dot pattern at the time is the same as the pattern shown in FIG. 8.

Figure 10C:
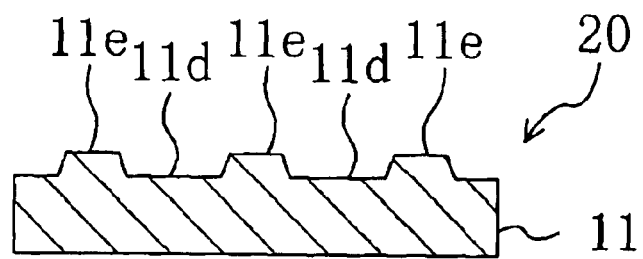

Now as shown in FIG. 10C, the base substrate 11 is etched using the patterned resist 12A as a mask by the RIE method in the same conditions as those according to the second embodiment. A low portion 11d having a depth of about 1 μm from the main surface of the base substrate 11 is formed. Then, the patterned resist 12A is removed away, so that a plurality of raised portion 11e in a dot pattern transferred from the pattern of the resist 12A are formed. The raised portion 11e has a sectional shape substantially identical to that shown in FIG. 2A, and has a width of about 10 μm. Side etching is performed so that the diameter of the side of the raised portion 11e at the upper part is smaller than that at the lower part by about 0.5 μm. The interval between the central positions of adjacent raised portions 11e is about 30 μm.

(Process of Nitride Semiconductor Growth)

Figure 11A:
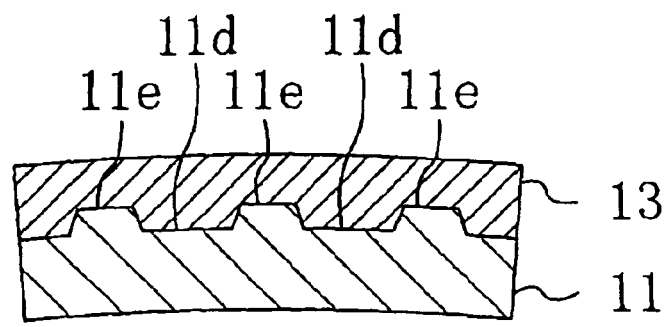
FIGS. 11A to 11C are sectional views showing the method of manufacturing a nitride semiconductor substrate according to the third embodiment.

As shown in FIG. 11A, a semiconductor layer 13 of gallium nitride is grown to have a thickness of about 200 μm at the upper part of the raised portion 11e on the irregular region 20 of the base substrate 11 in the conditions identical to the second embodiment by HVPE method using ammonia and gallium chloride as materials. Thus, the low portion 11d of the irregular region 20 is filled with the semiconductor layer 13, and the semiconductor layer 13 has an even surface. Then, when the substrate temperature is lowered to the vicinity of the room temperature, the thermal expansion coefficient difference between the semiconductor layer 13 and the base substrate 11 causes the base substrate 11 to bow as shown in FIG. 11A. The bow caused at the time depends little on the direction on the substrate surface, and the radius of curvature is about 1 m.

(Process of Laser Beam Irradiation)

According to the third embodiment, the output value of the laser emission portion 1 in the laser shown in FIG. 4 is large. An Nd: YAG laser, third harmonic having a wavelength of 355 nm is used for the laser beam. The laser beam having such a high output may have a beam diameter as large as about 5 mm and still may have an optical density of about 2.0 J/cm$^2$. Note however that the pulse cycle is as small as about 10 Hz because of the high output. The pulse width is about 10 ns, which is large enough for locally heating the interface between the base substrate 11 and the semiconductor layer 13.

Here, similarly to the first and second embodiments, sapphire is transparent to the laser beam irradiated upon the semiconductor layer 13 through the base substrate 11 from the backside of the base substrate 11.

When the semiconductor layer 13 is irradiated with a laser beam, at least the interface between the semiconductor layer 13 and the raised portion 11e must be irradiated, and therefore the entire surface of the semiconductor layer 13 is irradiated. More specifically, the base substrate 11 is irradiated sequentially from the periphery inwardly at intervals so that adjacent irradiation portions overlap by 2 mm. Note that the linear velocity of the laser beam during scanning is set to about 30 cm/s, so that the irradiation positions can be overlapped by 2 mm. More specifically, the laser beam is irradiated upon the base substrate 11 along the periphery, and after one round of laser beam irradiation, the irradiation position is shifted by 3 mm to the inner side of the base substrate 11, and adjacent irradiation positions in the radial direction can be overlapped by 2 mm.

As described above, the semiconductor layer 13 absorbs the irradiated laser beam and is heated. The pulse width of the laser beam is as short as about 10 ns, the optical density is large, and therefore the part of the semiconductor layer 13 irradiated with the laser beam is locally heated. This heating causes the part of the semiconductor layer 13 irradiated with the laser beam to thermally decompose, and a gallium layer 11c and a nitrogen gas result.

According to the third embodiment, a low portion 11d is formed at the laser irradiation position of the base substrate 11, and therefore the same effect as that by the second embodiment may be provided. More specifically, when the interface portion between the base substrate 11 and the semiconductor layer 13 is thermally decomposed, stress causing the upper part of the raised portion 11e to contract is released as the upper side part of the low portion 11d not irradiated with the laser beam in the semiconductor layer 13 is cleaved at the (0001) plane of the gallium nitride forming the semiconductor layer 13. The high pressure nitrogen gas caused by the thermal decomposition is diffused by the cleavage of the semiconductor layer 13 at the (0001) plane.

Figure 11B:
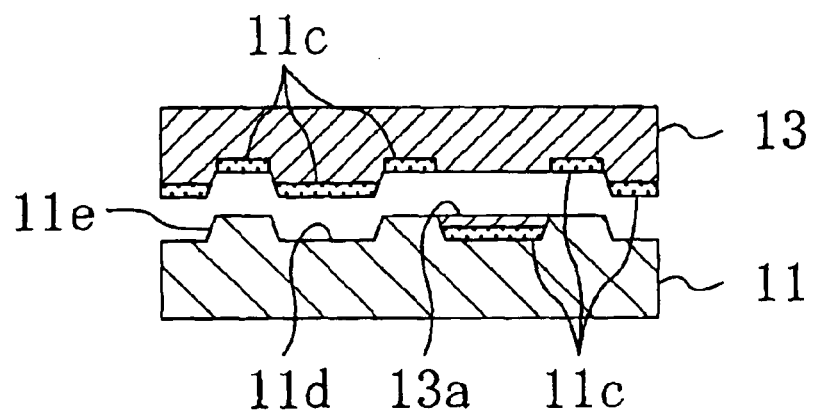

According to the third embodiment, this separation mechanism prevents cracks extending perpendicularly to the main surface in the semiconductor layer 13 during the laser beam irradiation. According to the third embodiment, the entire interface between the base substrate 11 and the semiconductor layer 13 is irradiated with a laser beam, so that the gallium layer 11c is generated almost on the entire interface. Since the laser beam intensity is as large as about 2.0 J/cm$^2$, the gallium layer 11c is also formed on the side of the raised portion 11e in the base substrate 11. As shown in FIG. 11B, the binding force of the gallium layer 11c is very small, and therefore the semiconductor layer 13 can be easily separated from the base substrate 11 simply by lifting the layer. At the time, the remaining portion 13a cleaved by cracks in the (0001) plane in the semiconductor layer 13 may be generated on the upper part of the low portion 11d of the base substrate 11.

Figure 11C:

Then, as shown in FIG. 11C, the gallium layer 11c is removed away by hydrogen chloride, and then the irregular part of the joining surface with the base substrate 11 in the semiconductor layer 13 is removed by polishing. A nitride semiconductor substrate 13A is thus produced from the semiconductor layer 13 of gallium nitride. The nitride semiconductor substrate 13A at the time has a diameter of about 5.1 cm (2 in.) and a thickness of about 180 μm and is in a bulk state without cracks or incomplete parts in the periphery.

As in the foregoing, according to the third embodiment, the irregular region 20 of the base substrate 11 has a plurality of raised portions 11e distributed at intervals of about 30 μm, while the beam diameter of the laser beam is as large as 5 mm, and therefore about at least 10,000 raised portions 11e can be irradiated at a time, which significantly reduces the time for irradiation. More specifically, according to the third embodiment, the laser beam irradiation can be completed within only about one minute to the 2-inch semiconductor layer 13.

Note that according to the third embodiment, a laser beam is irradiated upon only a part of the raised portion 11e of the base substrate 11, and the semiconductor layer 13 in the vicinity could be thermally decomposed. In this case, cracks perpendicular to the main surface of the base substrate 11 are not generated in the semiconductor layer 13, and the upper part of the low portion 11d in the semiconductor layer 13 is cleaved along the (0001) plane in the plane orientation of the semiconductor layer 13. As a result, if the beam diameter in the pulsed irradiation is large, the contraction stress of the base substrate 11 does not concentrate to introduce cracks or other breaks are not caused.

Also according to the third embodiment, the semiconductor layer 13 of gallium nitride is filled and grown on the main surface of the base substrate 11 having the irregular region 20 on the surface, and therefore the threading defect density at the upper part of the low portion 11d is about 1×10$^6$ cm$^{-2}$ on the surface of the semiconductor layer 13.

As described above, using the laser beam having a larger diameter, the time for laser beam irradiation can significantly be reduced, and the nitride semiconductor substrate 13A free from cracks or other breaks and having a region with a significantly reduced defect density can be provided.

Note that according to the third embodiment, the laser beam irradiation is performed to the entire surface of the semiconductor layer 13, while at least the interface part with the raised portion 11e in the base substrate 11 in the semiconductor layer 13 needs only be irradiated. In the case, the time for laser beam irradiation may be shortened as compared to the case of irradiating the entire surface.

[Fourth Embodiment]

A fourth embodiment of the present invention will be now described.

According to the fourth embodiment, the interval between the raised portions 11e in the irregular region 20 is different from that according to the second embodiment, and optimum dot pattern arrangement can be provided.

Here, in the irregular region 20 in FIG. 7C, the ratio of the area occupied by the raised portions 11e and the area occupied by the low portions 11d is changed, and the state of how the base substrate 11 and the semiconductor layer 13 are separated is observed.

As a first example, if the ratio of the area occupied by the low portions 11d to the area occupied by the raised portions 11e in the irregular region 20 is less than ⅕, and a part of the semiconductor layer 13 is thermally decomposed by laser beam irradiation thereupon, a region of the semiconductor layer 13 to be cleaved in the (0001) plane is not large enough. Therefore, cracks extending in the surface direction of the semiconductor layer 13 are formed.

Note that if the ratio of the area occupied by the low portions 11d to the area occupied by the raised portions 11e is about ⅕, raised portions 11e are connected with one another, and the low portions 11d are distributed in the raised portion 11e in the form of a recess seen in a cross section.

As a second example, if the ratio of the area occupied by the low portions 11d to the area occupied by the raised portions 11e is about ⅕ or more, in a plurality of produced samples, cracks generated in the semiconductor layer 13 do not extend in the surface direction of the semiconductor layer 13, and a bulk type substrate of gallium nitride having a diameter of 5.1 cm (2 in.) could be provided in some cases.

Therefore, more preferably, the ratio of the area occupied by the low portions 11d to the area occupied by the raised portions 11e is set to at least ½, so that a 2-inch, bulk type substrate of gallium nitride may be formed in almost all the plurality of samples.

As a third example, the case in which the area occupied by the low portions 11d is greater than the area occupied by raised portions 11e will be observed.

If the ratio of the area occupied by the low portions 11d to the area occupied by the raised portions 11e is about more than 100, and a laser beam is irradiated upon all the raised portions 11e, the region of the semiconductor layer 13 cleaved at the (0001) plane cannot reach the entire interface with the low portions 11d. Then, the semiconductor layer 13 cannot be separated from the base substrate 11. In order to surely separate the semiconductor layer 13 from the base substrate 11, the ratio of the area occupied by the low portions 11d to the area occupied by the raised portions 11e must be at most 100.

More preferably, the area occupied by the low portions 11d is at most 20 times the area occupied by the raised portions 11e in the irregular region 20, so that a 2-inch, bulk type substrate of gallium nitride can be obtained in almost all the plurality of produced samples.

It is understood that if the area occupied by the low portions 11d is so large that the semiconductor layer 13 cannot be separated from the base substrate 11, the joint region between the base substrate 11 and the semiconductor layer 13 may be irradiated with a laser beam once again to enable complete removal of the semiconductor layer 13.

Note that in the fourth embodiment, if the raised portions 11e are extremely unevenly arranged in the irregular region 20, for example if all the raised portions 11e are gathered in half the region of the main surface of the base substrate 11, the above result does not necessarily apply. Note however that if the density of raised portions 11e is determined in the irregular region 20 including several ten raised portions 11e and the density is almost equal, the above result applies.

What is claimed is:

1. A method of manufacturing a nitride semiconductor substrate, comprising:
   a first step of selectively forming a raised and recessed region in an upper portion of a base substrate;
   a second step of growing a semiconductor layer of nitride on said raised and recessed region in said upper portion of said base substrate so that a recessed portion in said raised and recessed region is filled and the upper surface thereof is even; and
   a third step of irradiating an interface between said semiconductor layer and said base substrate with a laser beam, thereby separating said semiconductor layer from said based substrate to form a semiconductor substrate from said semiconductor layer,
   wherein in said third step, the laser beam is irradiated upon said semiconductor layer from the surface opposite to the upper portion of said base substrate, so as to generate cracks at the interface between the top of the raised portion of the base substrate and the semiconductor layer.

2. The method of manufacturing a nitride semiconductor substrate according to claim 1, wherein in said third step, the laser beam is irradiated upon at least a raised portion in said raised and recessed region.

3. A method of manufacturing a nitride semiconductor substrate, comprising:
   a first step of selectively forming an irregular region on the main surface of a base substrate;
   a second step of growing a semiconductor layer of nitride on said irregular region in said base substrate so that a recessed portion in the irregular region is filled and the upper surface thereof is even; and
   a third step of irradiating an interface between said semiconductor layer and said base substrate with a laser beam, so as to generate cracks at the interface between the top of the raised portion of the base substrate and the semiconductor layer, thereby separating said semiconductor layer from said based substrate to form a semiconductor substrate from said semiconductor layer,
   wherein in said first step, a plurality of grooves extending parallel to each other are formed on said main surface of said base substrate, and
   wherein in said third step, the laser beam is irradiated upon at least a raised portion in said irregular region while scanning along raised portions surrounded by said plurality of grooves in said base substrate.

4. The method of manufacturing a nitride semiconductor substrate according to claim 3, wherein said base substrate comprises sapphire whose main surface is in the {0001} plane orientation, and the direction of the zone axis of each said groove is in the <1-100> direction in said base substrate.

5. A method of manufacturing a nitride semiconductor substrate, comprising:
   a first step of selectively forming an irregular region on the main surface of a base substrate;
   a second step of growing a semiconductor layer of nitride on said irregular region in said base substrate so that a recessed portion in the irregular region is filled and the upper surface thereof is even; and
   a third step of irradiating an interface between said semiconductor layer and said base substrate with a laser beam, so as to generate cracks at interface between the top of the raised portion of the base substrate and the semiconductor layer, thereby separating said semiconductor layer from said based substrate to form a semiconductor substrate from said semiconductor layer,
   wherein in said first step, a plurality of island shaped raised portions are formed on the main surface of said base substrate, and
   wherein in said third step, a pulsed laser beam is irradiated upon at least a raised portion in said irregular region while scanning in synchronization with said plurality of raised portions in said base substrate.

6. A method of manufacturing a nitride semiconductor substrate, comprising:
   a first step of selectively forming an irregular region on the main surface of a base substrate;
   a second step of growing a semiconductor layer of nitride on said irregular region in said base substrate so that a recessed portion in the irregular region is filled and the upper surface thereof is even; and
   a third step of irradiating an interface between said semiconductor layer and said base substrate with a laser beam, so as to generate cracks at the interface between the top of the raised portion of the base substrate and the semiconductor layer, thereby separating said semiconductor layer from said based substrate to form a semiconductor substrate from said semiconductor layer, wherein in said third step, the laser beam is irradiated simultaneously upon the plurality of raised portions in said irregular region.

7. A method of manufacturing a nitride semiconductor substrate, comprising:
- a first step of selectively forming an irregular region on the main surface of a base substrate;
- a second step of growing a semiconductor layer of nitride on said irregular region in said base substrate so that a recessed portion in the irregular region is filled and the upper surface thereof is even; and
- a third step of irradiating an interface between said semiconductor layer and said base substrate with a laser beam, so as to generate cracks at the interface between the top of the raised portion of the base substrate and the semiconductor layer, thereby separating said semiconductor layer from said based substrate to form a semiconductor substrate from said semiconductor layer,
- wherein in said first step, the area occupied by the recessed portions is about in the range from about $1/5$ to about 100 times the area occupied by the raised portions.

8. A method of manufacturing a nitride semiconductor substrate, comprising:
- a first step of selectively forming an irregular region on the main surface of a base substrate;
- a second step of growing a semiconductor layer of nitride on said irregular region in said base substrate so that a recessed portion in the irregular region is filled and the upper surface thereof is even; and
- a third step of irradiating an interface between said semiconductor layer and said base substrate with a laser beam, so as to generate cracks at the interface between the top of the raised portion of the base substrate and the semiconductor layer, thereby separating said semiconductor layer from said based substrate to form a semiconductor substrate from said semiconductor layer,
- wherein in said third step, the laser beam is irradiated from the surface opposite to the main surface of said base substrate.

9. The method of manufacturing a nitride semiconductor substrate according to claim 1, wherein said cracks extend in parallel to the main surface of the base substrate.

10. The method of manufacturing a nitride semiconductor substrate according to claim 3, wherein said cracks extend in parallel to the main surface of the base substrate.

11. The method of manufacturing a nitride semiconductor substrate according to claim 5, wherein said cracks extend in parallel to the main surface of the base substrate.

12. The method of manufacturing a nitride semiconductor substrate accordng to claim 6, wherein said cracks extend in parallel to the main surface of the base substrate.

13. The method of manufacturing a nitride semiconductor substrate according to claim 7, wherein said cracks extend in parallel to the main surface of the base substrate.

14. The method of manufacturing a nitride semiconductor substrate according to claim 8, wherein said cracks extend in parallel to the main surface of the base substrate.

* * * * *